(12) United States Patent
Ha et al.

(10) Patent No.: US 8,013,946 B2
(45) Date of Patent: Sep. 6, 2011

(54) METHOD FOR FABRICATION LIQUID CRYSTAL DISPLAY DEVICE AND DIFFRACTION MASK THEREFOR

(75) Inventors: Yong Min Ha, Gumi (KR); Hun Jeoung, Chilgok-Gun (KR); Jeong Woo Jang, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 850 days.

(21) Appl. No.: 12/018,745

(22) Filed: Jan. 23, 2008

(65) Prior Publication Data

US 2008/0131818 A1 Jun. 5, 2008

Related U.S. Application Data

(62) Division of application No. 11/010,528, filed on Dec. 13, 2004, now Pat. No. 7,405,776.

(30) Foreign Application Priority Data

Dec. 29, 2003 (KR) .................. 10-2003-0099306

(51) Int. Cl.
*G02F 1/136* (2006.01)
(52) U.S. Cl. ........................................... 349/47
(58) Field of Classification Search .............. 349/47, 349/43, 114; 257/59
See application file for complete search history.

(56) References Cited

FOREIGN PATENT DOCUMENTS

| KR | 2002-13309 | 2/2002 |
|---|---|---|
| KR | 2002-36023 | 5/2002 |
| KR | 2003-65410 | 8/2003 |
| KR | 2003-94528 | 12/2003 |

OTHER PUBLICATIONS

Office Action issued in corresponding Korean Patent Application No. 10-2003-0099306, mailed Aug. 30, 2010. 5 pages.

*Primary Examiner* — James A Dudek
(74) *Attorney, Agent, or Firm* — Brinks Hofer Gilson & Lione

(57) ABSTRACT

An LCD is fabricated using a diffraction mask with transmissive, semi-transmissive, and opaque regions. The semi-transmissive region permits formation of a transmission, reflection, or pixel electrode, depending on the type of LCD being fabricated, using the same masking process as that to produce contact holes in an insulating film and a conductive layer. Photoresist exposed through the semi-transmissive region is partially removed during developing that completely removes photoresist in the transmissive or opaque region. The contact holes are formed in the region in which the photoresist is completely removed, the photoresist and underlying conductive layer in the semi-transmissive region are then removed, and the remaining photoresist is stripped.

3 Claims, 11 Drawing Sheets

METHOD FOR FABRICATION LIQUID CRYSTAL DISPLAY DEVICE AND DIFFRACTION MASK THEREFOR

This application is a divisional of U.S. application Ser. No. 11/010,528 filed on Dec. 13, 2004 now U.S. Pat. No. 7,405,776 which claims the benefit of Korean Patent Application No. 2003-99306, filed in Korea on Dec. 29, 2003. the disclosure of which is hereby incorporated by reference.

BACKGROUND

1. Field

The present application relates to a method for fabricating a liquid crystal display (LCD) device and, more particularly, to a method for fabricating an LCD device capable of enhancing productivity by improving a masking process with a diffraction mask, and the diffraction mask used therefor.

2. Description of the Related Art

Increasing concentration on information display and demands on a mobile information medium have created a drive for research of a light-weight flat panel display (FPD) to replace existing display device CRT (Cathode Ray Tube) technology. In particular, among various types of flat panel displays, liquid crystal displays (LCD) are predominantly used in notebook or desktop computers thanks to their excellent resolution, color display and picture quality.

In general, the LCD displays a desired image by individually supplying a data signal according to image information to liquid crystal cells arranged in a matrix form and controlling light transmittance of the liquid crystal cells.

For this purpose, the LCD includes a liquid crystal display panel including a driving circuit unit and outputting an image, a backlight unit installed at a lower portion of the liquid crystal display panel and emitting light to the liquid crystal display panel, and a case for coupling the backlight unit and the liquid crystal display panel.

The liquid crystal display panel includes a color filter substrate, an array substrate and a liquid crystal layer formed between the color filter substrate and the array substrate.

The color filter substrate includes a color filter consisting of red, green and blue sub-color filters implementing color, a black matrix dividing the sub-color filters and blocking a light from transmitting a liquid crystal layer, and a transparent common electrode applying a voltage to the liquid crystal layer.

The array substrate includes a plurality of gate lines and data lines arranged vertically and horizontally on the substrate to define a plurality of pixel regions, a thin film transistor (TFT), a switching device, formed at the crossings of the gate lines and the data lines, and a pixel electrode formed on the pixel region.

The color filter substrate and the array substrate are attached by a sealant formed at an outer edge of an image display region to constitute a liquid crystal display panel. Attachment of the two substrates is made through an attachment key formed at the color filter substrate or the array substrate.

A thin film transistor is used as the switching device of the liquid crystal display panel. An amorphous silicon thin film or a polycrystalline silicon thin film is used as a channel layer of the thin film transistor.

The polycrystalline silicon thin film transistor has high field effect mobility, so that an operation frequency of a driving circuit unit determining the number of driving pixels can be enhanced and thus the display device can have a fine pitch. In addition, since a charge time of a signal voltage of a pixel unit is reduced, distortion of a transmission signal can be reduced, and thus, picture quality can be improved.

Moreover, because the polycrystalline silicon TFT can be driven with a voltage less than 10V, compared to the amorphous silicon TFT having a high driving voltage (~25V), power consumption can be reduced.

As mentioned above, the LCD is fabricated using several masking processes (namely, photolithography processes), which will be described as follows.

FIGS. 1A to 1G are sequential sectional view of a general process of fabricating an LCD, showing an array substrate of a trans-reflective LCD with a pixel electrode consisting of transmission electrode and reflection electrode.

As shown in FIG. 1A, a polycrystalline silicon TFT is formed on a transparent substrate 10 and patterned through a first masking process to form an island type active pattern 11.

Next, as shown in FIG. 1B, a first insulation film 13 and a first metal film are sequentially deposited at the entire surface of the substrate 10 with the active pattern 11 formed thereon, and then, the first metal film is patterned through a second masking process to form a gate electrode 15 with the first insulation film 13 formed on the active pattern 11.

And then, impurity ions are injected at both sides of the active layer 11 by using the gate electrode 15 as a mask to form source/drain regions 11a and 11b.

Thereafter, as shown in FIG. 1C, a second insulation film 14 is deposited at the entire surface of the substrate 10 with the gate electrode 15 formed thereon, and then a portion of the first and second insulation films 13 and 14 are removed through a third masking process, thereby forming first and second contact holes 17b exposing a portion of the source and drain regions 11a and 11b.

And then, as shown in FIG. 1D, a transparent conductive material is deposited on the second insulation film 14 with the first and second contact holes 17a and 17b formed and patterned through a fourth masking process to form a pixel electrode 21.

Subsequently, as shown in FIG. 1E, a second metal film is formed at the contact holes 17a and 17b and the pixel electrode 21 and patterned through a fifth masking process to form source and drain electrodes 19a and 19b.

The source electrode 17a is electrically connected with the source region 11a through the first contact hole 17a and the drain electrode 17b is electrically connected with the drain region 11b through the second contact hole 11b.

And then, as shown in FIG. 1F, a third insulation film 16 is deposited at the entire surface of the substrate 10 including the source/drain electrodes 19a and 19b and patterned through a sixth masking process to form a third contact hole 17b exposing a portion of the drain electrode 19b, and expose a pixel electrode of the transmitting part (T).

Finally, as shown in FIG. 1G, a third metal film is deposited on the third insulation film 16 including the third contact hole 17c and patterned through a seventh masking process to form a reflection electrode 23 exposing the transmitting part (T). In this case, the reflection electrode 23 is electrically connected with the drain electrode 19b through the third contact hole 17c, the region of which becomes a reflecting part (R).

As mentioned above, the lower array substrate of the general trans-reflective LCD is fabricated through seven masking processes, namely, photolithography processes. However, each photolithography process is a series of processes for forming a desired pattern by transferring a pattern drawn on a mask to the thin film-deposited substrate by coating sensitizing solution on the substrate, exposing and developing the solution. As a result, the photolithography processes degrade production yield and heighten the probability that the TFT is defective.

In addition, since the mask designed for forming the pattern is very expensive, an increase in the number of masks applied to the processes leads to a proportional increase in the fabrication cost of the LCD.

SUMMARY

By way of introduction only, a method for fabricating a display such as an LCD is provided that simplifies manufacture and enhances productivity by forming a contact hole exposing a drain region of a TFT and a transmission electrode connected with the contact hole using a single masking process. In one embodiment a diffraction mask is used.

In a first embodiment of a method for fabricating an LCD, an active pattern, a first insulation film and a gate electrode are formed on a substrate. Impurity ions are injected into a region of the active pattern, using the gate electrode as a mask, to form source and drain regions. A second insulation film is formed on the substrate and a transparent conductive film is formed on the second insulation film. A portion of the transparent conductive film and the first and second insulation films is removed to form a transmission electrode and first and second contact holes exposing a portion of the source and drain regions. Source and drain electrodes are formed on the substrate. The source electrode is connected with the source region through the first contact hole. The drain electrode is connected with the drain electrode through the second contact hole and connected with the transmission electrode. A third insulation film is formed on the substrate and then patterned to form a third contact hole exposing a portion of the drain electrode. A reflection electrode is formed on the substrate. The reflection electrode is connected with the drain electrode and connected with the transmission electrode.

In this case, formation of the first and second contact holes and the transmission electrode may include coating a photoresist film on the second insulation film and irradiating the photoresist film with light passing through a mask. The mask has a first transmission region that transmits a portion of the light, a second transmission region that transmits substantially all of the light and a blocking region that blocks the light. The irradiated photoresist film is developed to form a first photoresist film pattern with a first thickness at a first region corresponding to the first transmission region and a second photoresist film pattern with a second thickness at a second region corresponding to the blocking region. A portion of the first and second insulation films and the transparent conductive film is removed, using the first and second photoresist film patterns as a mask, to form first and second contact holes exposing a portion of the source and drain regions. The first photoresist film pattern is removed and the transparent conductive film is patterned, using the second photoresist film pattern as a mask, to form the transmission electrode.

In another embodiment, the method includes forming an active pattern and a gate electrode on a substrate and forming a passivation film and a transparent conductive film on the gate electrode. Contact holes and a transmission electrode are formed using a single masking process. The contact holes expose sides of the active pattern. An opaque conductive film is formed in the contact holes and on the transmission electrode. The opaque conductive film is patterned to form a source electrode connected to a first side of the active pattern and a drain electrode connected to a second side of the active pattern and to the transmission electrode. An organic film is formed on the substrate and patterned the organic film to make a surface of the organic film concavo-convex. The concavo-convex organic film is patterned to form a contact hole exposing a portion of the drain electrode. An opaque metal film is formed on the organic film and patterned to form a reflection electrode connected to the drain electrode and the transmission electrode.

In another embodiment, the method includes forming an active pattern, a first insulation film and a gate electrode on a substrate, injecting impurity ions into a region of the active pattern, using the gate electrode as a mask, to form source and drain regions and forming a second insulation film and a transparent conductive film on the substrate. A portion of the transparent conductive film and the first and second insulation films is removed to form a pixel electrode and first and second contact holes exposing a portion of the source and drain regions and source and drain electrodes are formed. The source electrode is connected with the source region through the first contact hole. The drain electrode is connected with the drain electrode through the second contact hole and is connected with the pixel electrode.

In another embodiment, the method includes forming an active pattern, a first insulation film and a gate electrode on a substrate, injecting impurity ions into a region of the active pattern, using the gate electrode as a mask, to form source and drain regions and forming a second insulation film and an opaque conductive film on the substrate. A portion of the opaque conductive film and the first and second insulation films is removed to form a reflection electrode and first and second contact holes exposing a portion of the source and drain regions and source and drain electrodes are formed on the substrate. The source electrode is connected with the source region through the first contact hole. The drain electrode is connected with the drain electrode through the second contact hole and connected with the reflection electrode.

In another embodiment, the method includes forming an insulating layer and a first conductive layer on a substrate of the display, coating a photoresist film on the insulating and first conductive layers, and aligning a mask through which light impinging thereon is partially transmitted in a first region, substantially fully transmitted in a second region, and substantially blocked in a third region. The photoresist film is exposed to light passing through the mask. The photoresist film is developed such that photoresist of a first thickness remains in the first region and either: photoresist of a second thickness remains in the third region and no photoresist remains in the second region or photoresist of the second thickness remains in the second region and no photoresist remains in the third region. The insulating and first conductive layers in the region in which no photoresist remains are etched through to expose an underlying second conductive layer through contact holes, the photoresist and underlying first conductive layer in the first region is removed, and then the photoresist in the region in which the photoresist of the second thickness was developed is removed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

A method for fabricating an LCD and a diffraction mask used therefor in accordance with an embodiment of the present invention will now be described with reference to the accompanying drawings.

A transmission type LCD uses light emitted from a light source, a backlight, positioned at a lower portion of a liquid crystal display panel to display images. However, the amount of light transmitted from the liquid crystal display panel is only about 7% of the light generated by the backlight. As a substantial amount of the generated light is lost, power consumption of the backlight is large.

To decrease power consumption, a reflection type LCD that does not employ the backlight has been studied. The reflection type LCD uses external light rather than light generated by a backlight. In this case, as no backlight is present, no power is consumed by the backlight. This allows the LCD to be used for a long time without needing to be recharged. Unlike the existing transmission type LCD, the reflection type LCD reflects light incident from outside by using a reflective opaque material on a pixel region. However, since an external light source does not always exist, the reflection type LCD can be used during day time when natural light exists or in an office or inside a building where an artificial light source exists, but cannot used in a dark environment when the external light source does not exist.

Thus, a trans-reflective LCD may be used. The trans-reflective LCD couples the advantages of a reflection type LCD and a transmission type LCD. The trans-reflective LCD can be freely switched between a reflection mode and a transmission mode as desired. As the trans-reflective LCD can use light of the backlight or an external light source, it can be used in various lighting conditions and still reduce power consumption.

Figure 1A:
FIGS. 1A to 1G are sequential sectional views showing a general process of fabricating an LCD.
Figure 1B:
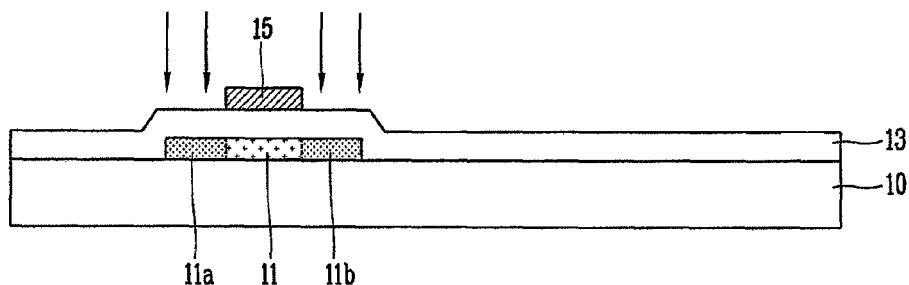
Figure 1C:
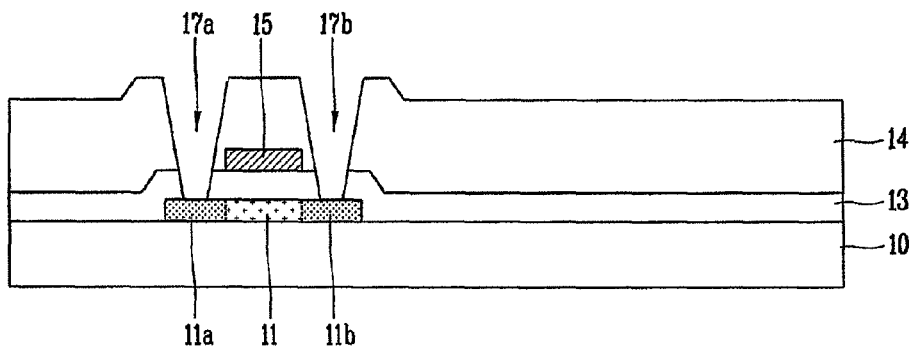
Figure 1D:
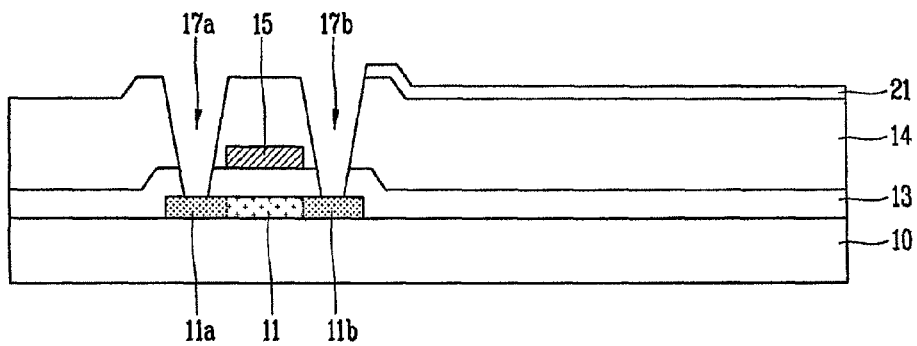
Figure 1E:
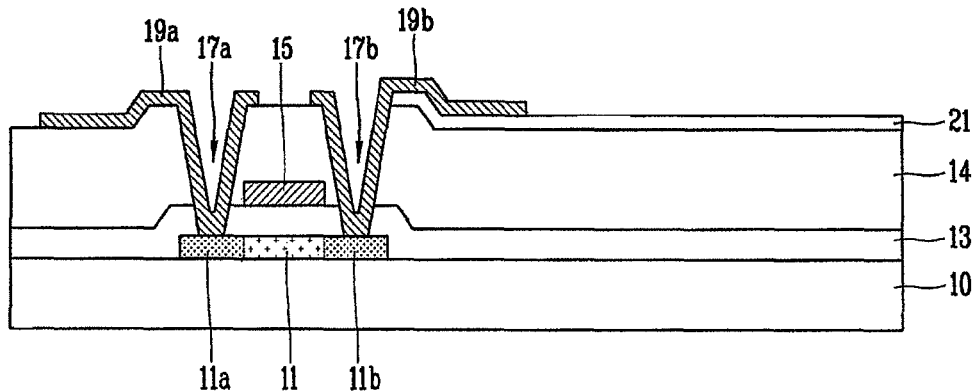
Figure 1F:
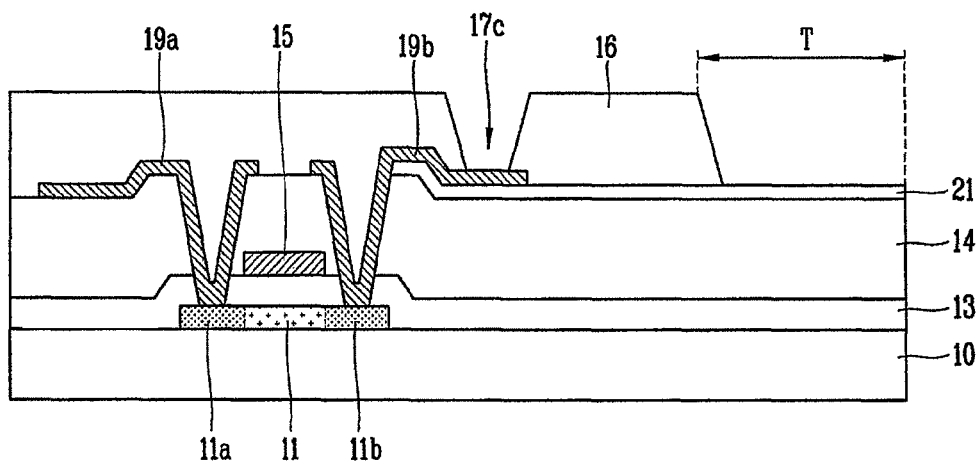
Figure 1G:
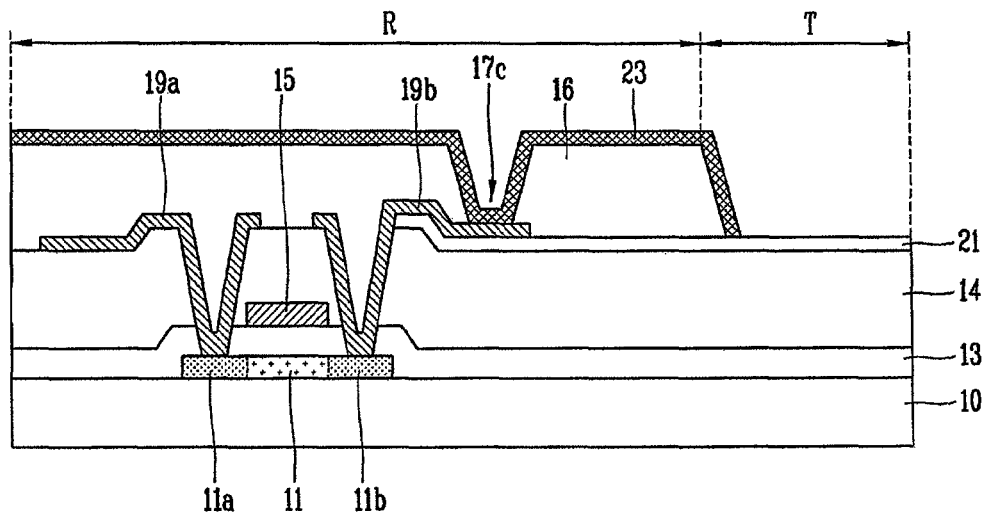
Figure 2:
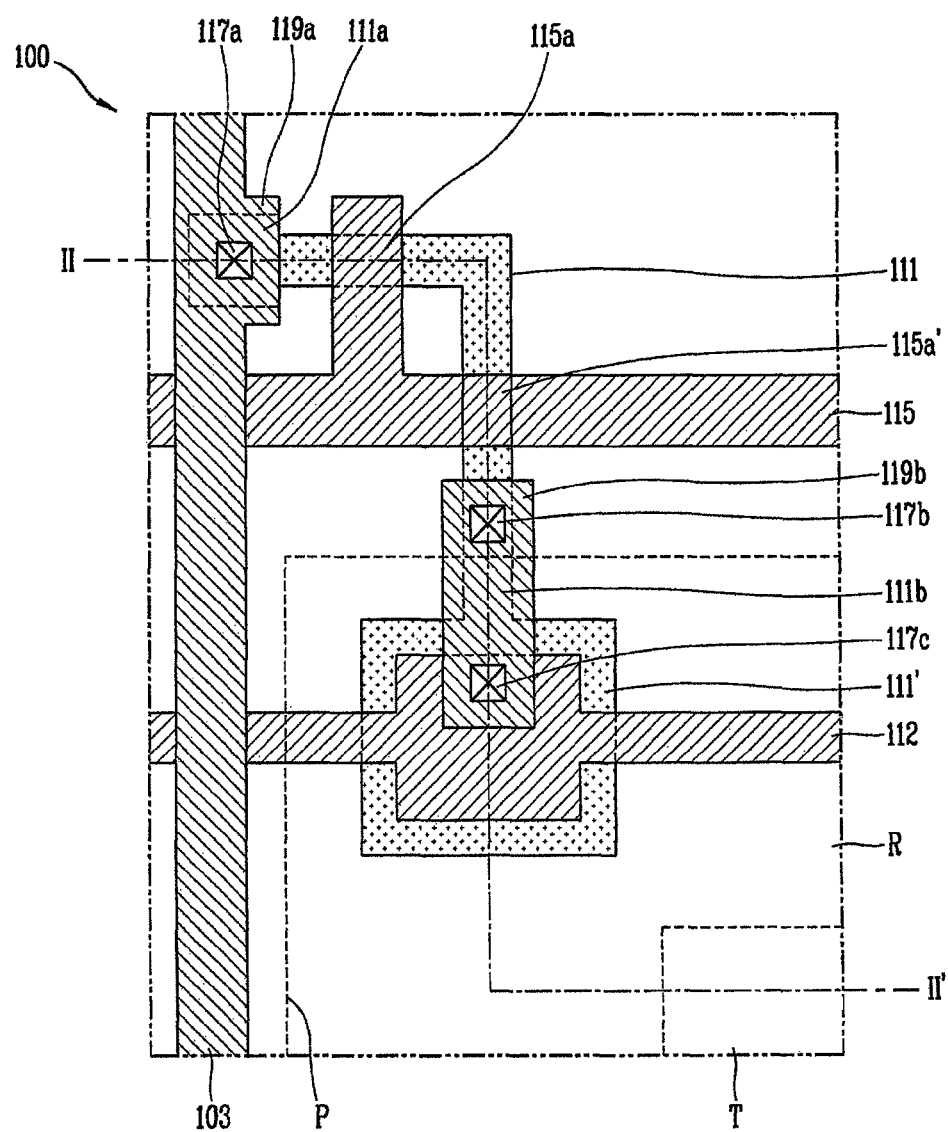
FIG. 2 is a plan view showing a portion of an LCD in accordance with one embodiment.

FIG. 2 is a plan view showing a portion of a trans-reflective LCD in accordance with one embodiment of the present invention, showing a portion of an array substrate with a TFT. As shown, in an LCD 100, a gate line 115 and a data line 103 are horizontally and vertically arranged, and a TFT having double gate electrodes 115a and 115a' is formed at a crossing of the gate line 115 and the data line 103.

The TFT includes an active pattern 111, gate electrodes 115a and 115a' and source/drain electrodes 119a and 119b formed on the active pattern 111. A portion of the active pattern 111 is extended to form a storage lower electrode 111'. A storage upper electrode 112 is formed at an upper portion of the storage lower electrode 111' to form a storage capacitor (Cst).

The gate electrodes 115a and 115a' include a first gate electrode 115a protruding from the gate line 115 and a second gate electrode 115a' formed as a portion of the gate line 115 overlapping the active pattern 111. The source electrode 119a protrudes from the data line 103 and is electrically connected with a source region 111a through a first contact hole 117a.

One side of the drain electrode 119b is connected with a drain region 111b through a second contact hole 117b. The other side of the drain electrode 119b is connected with a pixel electrode, namely, with a transmission electrode formed at a transmitting part (T) and a reflection electrode formed at a reflecting part (R).

In the LCD 100, when a high level gate signal is applied to the gate electrodes 115a and 115a', a channel through which electrons can move is formed in the active pattern 111, so that a data signal of the source electrode 119a is transferred to the drain electrode 119b by way of the active pattern 111. The storage capacitor (Cst) charges a gate voltage while a gate signal is being applied to the gate electrodes 115a and 115a', and discharges the charged voltage while a data voltage is being supplied to the pixel electrode when the next gate line is driven, thereby preventing voltage change of the pixel electrode. When a low level gate signal is applied to the gate electrodes 115a and 115a', the channel formed in the active pattern 111 is cut off and transmission of the data signal to the drain electrode 119b is interrupted.

When the double gate electrodes are used, a leakage current generated when the gate signal is cut off can be reduced. However, a single gate electrode can be also used.

In addition, although a trans-reflective LCD is shown, a transmission type LCD in which only a transmission electrode is formed at the pixel region (P) or a reflection type LCD in which only a reflection electrode is formed at the pixel region may be fabricated.

FIGS. 3A to 3F are sequential sectional views showing a process of fabricating the LCD of FIG. 2 taken along line II-II'.

Figure 3A:
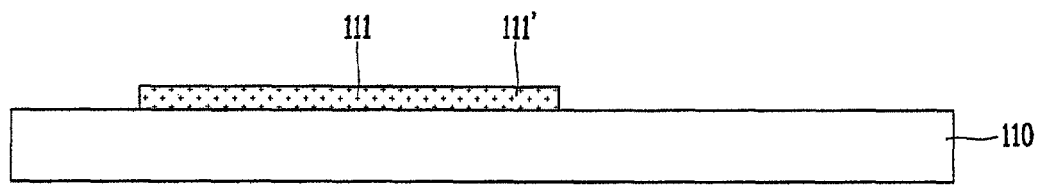
FIGS. 3A to 3F are sequential sectional views showing a process of fabricating the LCD of FIG. 2 taken along line II-II'.

As shown in FIG. 3A, a substrate 110 made of a transparent insulation material is prepared. A polycrystalline silicon thin film is formed on the substrate 110 and patterned through a first masking process to form an active pattern 111 and a storage lower electrode 111' extending from the active pattern 111.

The active pattern 111 can be formed by various crystallization methods after depositing an amorphous silicon thin film on the substrate 110, which will be described as follows.

First, the amorphous silicon thin film can be deposited through various methods. Typical methods for depositing the amorphous silicon thin film include low pressure chemical vapor deposition (LPCVD) and plasma enhanced chemical vapor deposition (PECVD).

Thereafter, dehydrogenation is performed to remove hydrogen atoms existing in the amorphous silicon thin film, and then, crystallization can proceed. General thermal treatments for crystallizing the amorphous silicon thin film include solid phase crystallization (SPC) and excimer laser annealing (ELA).

In laser crystallization, ELA using a pulse form laser is commonly used. Recently however, sequential lateral solidification (SLS) has been proposed and widely studied. SLS improves crystallization characteristics remarkably by growing the grains in a lateral direction. SLS uses the fact that grains grow in a vertical direction at an interface of liquid phase silicon and solid phase silicon. By growing grains to a certain length laterally by suitably controlling the laser energy and laser beam irradiation range, the size of the silicon grains can be enhanced.

Meanwhile, though not shown, before forming the active pattern 11, a silicon oxide film ($SiO_2$) or a silicon nitride film (SiNx) can be formed as a buffer layer on the substrate 110. The buffer layer serves to prevent infiltration of impurities such as sodium (Na) existing in the glass substrate 110 into an upper layer during later processes (notably, crystallization).

Figure 3B:
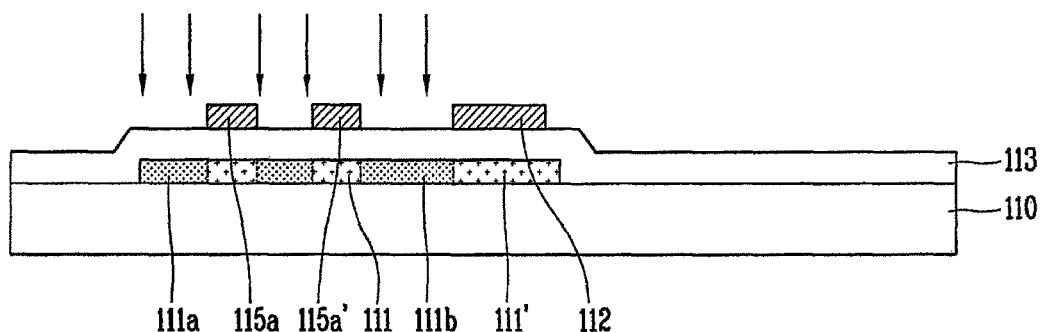

Next, as shown in FIG. 3B, a first insulation film 113, a gate insulation film, and a first metal film formed as a double layer of aluminum (Al), molybdenum (Mo), copper (Cu) or Al and Mo are deposited at the entire surface of the substrate 110 including the active pattern 111 and the storage lower electrode 111'. The first metal film is then patterned through a second masking process to form gate electrodes, namely, a first gate electrode 115a and a second gate electrode 115a', at an upper side of the active pattern 111 and form a storage upper electrode 112 at an upper side of the storage lower electrode 111'. In this case, the storage lower electrode 111' and the storage upper electrode 112 form a storage capacitor (Cst) with the first insulation film 113 interposed therebetween.

Thereafter, impurity ions (dopants) are injected to a region of the active pattern 111 by using the first and second gate electrodes 115a and 115a' and the storage upper electrode 112 as a mask, thereby forming a source region 111a and a drain region 111b. Electrical characteristics of the active pattern 111 vary depending on the injected dopant. If the injected dopant is a group 3 element such as boron (B), a PNP TFT is formed, and if the injected dopant is a group 5 element such as phosphorous (P), an NPN TFT is formed.

Figure 3C:
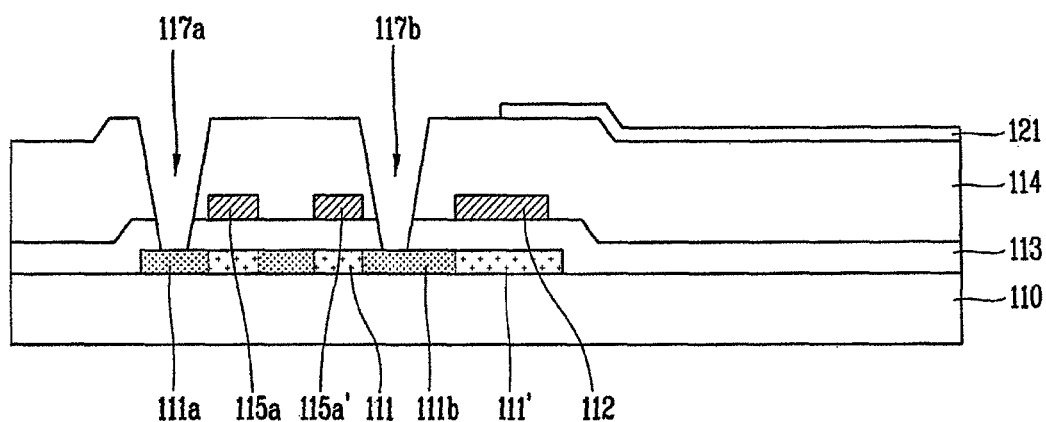

When the source/drain regions 111a and 111b are completely formed through the injection of the impurities, as shown in FIG. 3C, a second insulation film 114 and a transparent conductive material are deposited and then patterned. The transparent conductive material is, for example, indium tin oxide (ITO) or indium zinc oxide (IZO). The patterning occurs using a third masking process to form a first contact hole 117a and a second contact hole 117b exposing a portion of the source region 111a and the drain region 111b. At the same time, a transmission electrode 121 is formed at the pixel region.

As the contact holes 117a and 117b and the transmission electrode 121 are simultaneously formed in the third masking process, a slit mask or a half-tone mask is used. The slit mask includes a light transmission region having a slit structure. An amount of exposed light irradiated through the slit region is smaller than an amount of exposed light irradiated on a complete transmission region that transmits light entirely. Thus, after a photoresist film is coated, if the photoresist film is exposed by using a mask having a slit region and a complete transmission region, the thickness of the photoresist film remaining at the slit region and the thickness of the photoresist film remaining at the complete transmission region are different. Namely, for a positive type photoresist film, the photoresist film irradiated by light through the slit region is thicker than that of the complete transmission region. For a negative type photoresist film, the photoresist film remaining at the complete transmission region is thicker.

A large diffraction pattern can be implemented by successively disposing diffraction slits horizontally or vertically to simultaneously form contact holes and the transmission electrode using a single masking process, which will now be described in detail.

FIGS. 4A to 4D are sectional view showing the third masking process in accordance with the present invention, in which contact holes and transmission electrode are simultaneously formed through a diffraction mask.

Figure 4A:
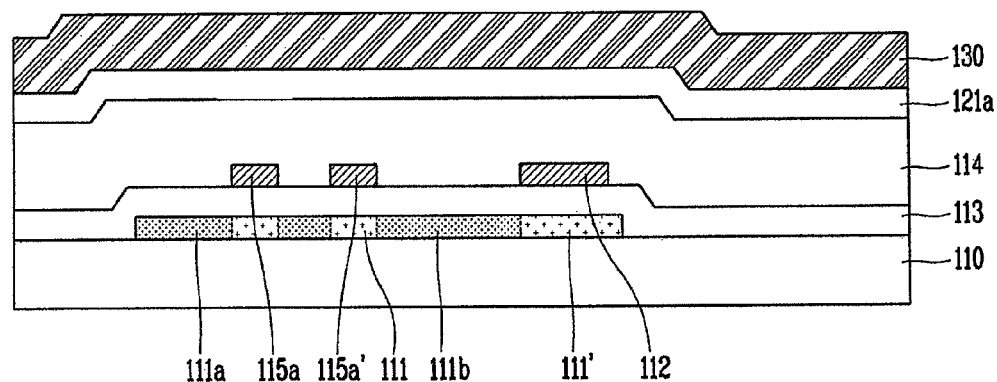
FIGS. 4A to 4D are sectional view showing a third masking process in accordance with the present invention.

As shown in FIG. 4A, a second insulation film 114 and a transparent conductive material 121a are deposited on the entire surface of the substrate 110. A photoresist film 130 is coated on the transparent conductive material 121a.

Figure 4B:
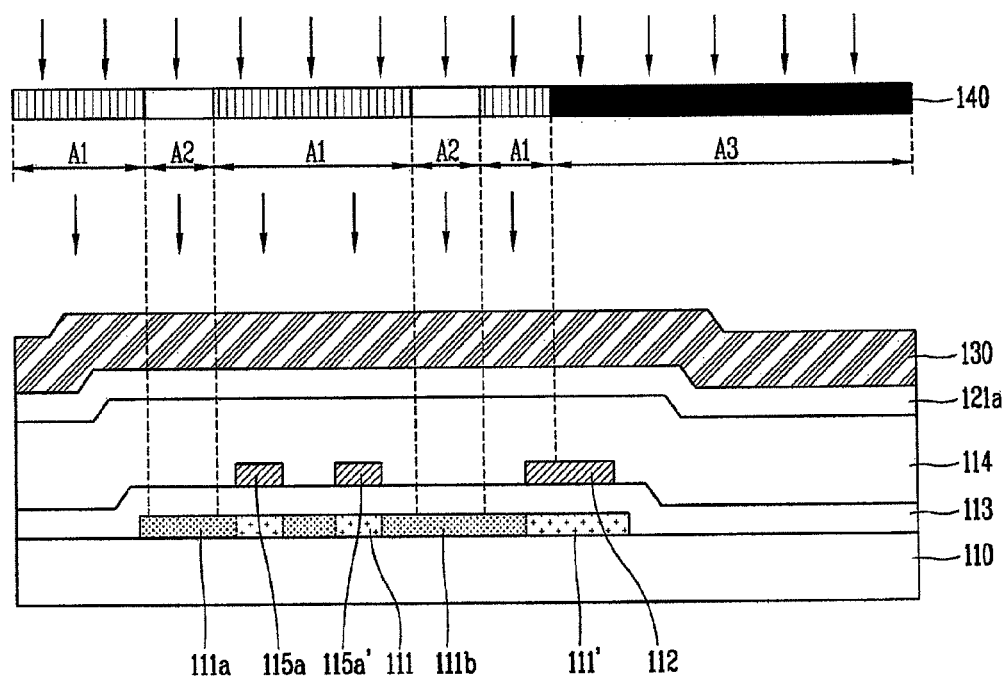

Next, as shown in FIG. 4B, the photoresist film 130 is irradiated by light that passes through a diffraction mask 140. The diffraction mask 140 includes a first transmission region A1 transmitting a portion of the incident light, a second transmission region A2 transmitting substantially all of the incident light and a blocking region A3 that blocks the incident light. Only light transmitted through the mask 140 irradiates the photoresist film 130.

Figure 4C:
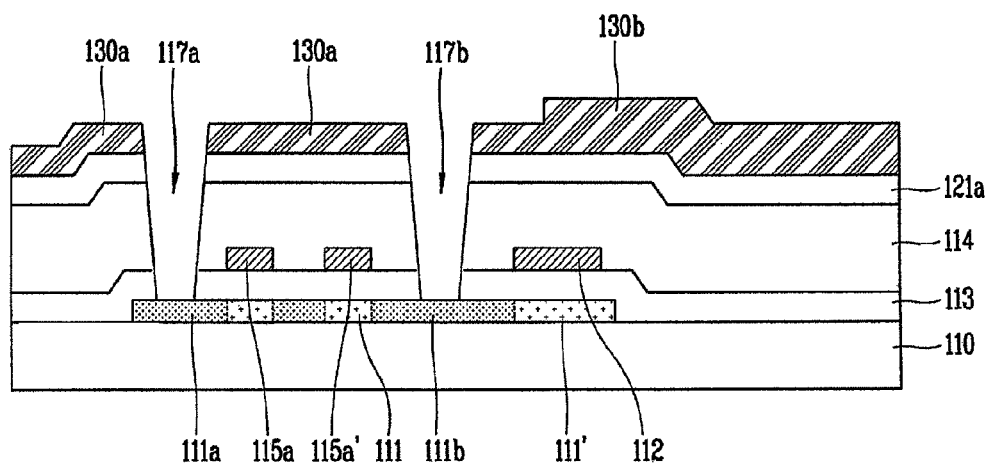

Subsequently, as shown in FIG. 4C, when the photoresist film 130 that has been exposed through the diffraction mask 140 is developed, the photoresist film remains in regions in which the incident light has been partially transmitted through the first transmission region A1 or has been blocked by the blocking region A3. No photoresist film remains in the region defined by the second transmission region A2 of the mask.

The first photoresist film pattern 130a formed at the region corresponding to the first transmission region A1 after development is thinner than the second photoresist film pattern 130b formed at the region corresponding to the blocking region A3. This is because a positive type photoresist film has been used. However, a negative type photoresist film can be also used.

Subsequently, the conductive film 121a, the second insulation film 114 and the first insulation film 113 are removed in turn by using the first photoresist film pattern 130a and the second photoresist film pattern 130b as a mask to form the first and second contact holes 117a and 117b exposing a portion of the source and drain regions 111a and 111b.

After the first and second contact holes 117a and 117b are formed, the first photoresist film pattern 130a is completely removed through ashing. At this time, a portion of the second photoresist film pattern 130b is also removed, so its thickness is reduced.

Figure 4D:
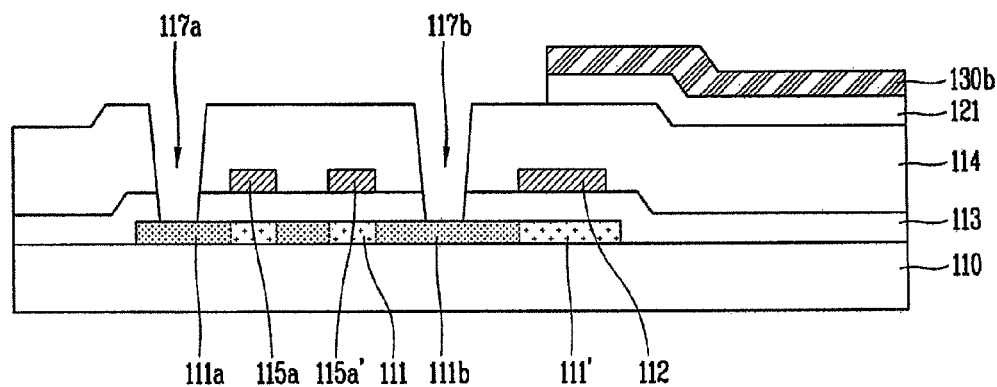

And then, as shown in FIG. 4D, the exposed conductive film 121a is removed using the second photoresist film pattern 130b as a mask to form the transmission electrode 121. Thereafter, the second photoresist film pattern 130b remaining on the transmission electrode 121 can be removed by using a stripper.

As mentioned above, in the third masking process, the contact holes and the transmission electrode can be simultaneously formed using a single masking process by using the diffraction mask. In particular, the diffraction slit is applied to the entire pixel region except for the region where contact holes and the transmission electrode are formed, for which, thus, a large diffraction mask is used. This will now be described in detail.

Figure 5:
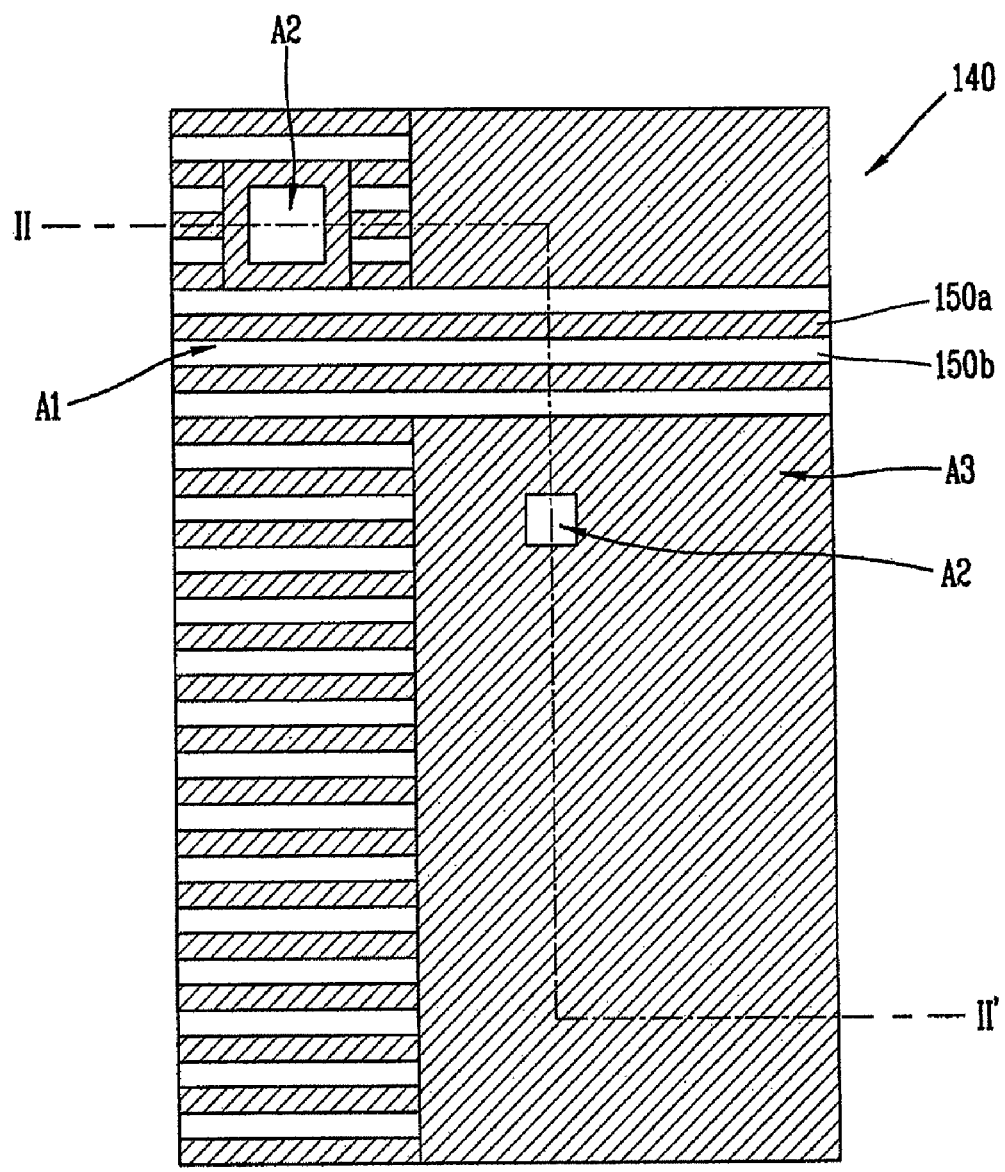
FIG. 5 is a plan view showing a diffraction mask used for fabrication of the LCD in accordance with one embodiment.

FIG. 5 is a plan view showing a diffraction mask used for fabrication of the LCD in accordance with the present invention, in which a large diffraction mask used for the third masking process is shown. Though the diffraction mask designed to be applied for the positive type photoresist film is taken as one example, the mask pattern may be constructed as a reverse image of that shown when using a negative type photoresist film.

As shown, the diffraction mask 140 includes the second transmission region A2 for forming contact holes and the blocking region A3 for forming the transmission electrode. The first transmission region A1 is formed as a large pattern of slits disposed consecutively in a horizontal direction.

The second transmission region A2 completely transmits the light incident thereon to form contact holes exposing a portion of the source/drain region. The first transmission region A1, which is formed as a diffraction pattern, transmits only a portion of the light incident thereon, so that the transmission electrode can be formed only at the blocking region A3. The diffraction pattern constituting the first transmission region A1 has the form of slits disposed successively in the horizontal direction, consisting of a bar 140a for blocking light partially and a space 150b for transmitting light. Though the bar 150a or the space 150b can vary depending on the exposing equipment and process conditions, they can be designed to have a width of about 1 μm to about 2 μm.

Although this embodiment shows the diffraction mask includes a diffraction pattern that extends in the horizontal direction, the present invention is not limited thereto. In other embodiments, a diffraction mask that includes various types of diffraction patterns can be used.

Figure 6A:
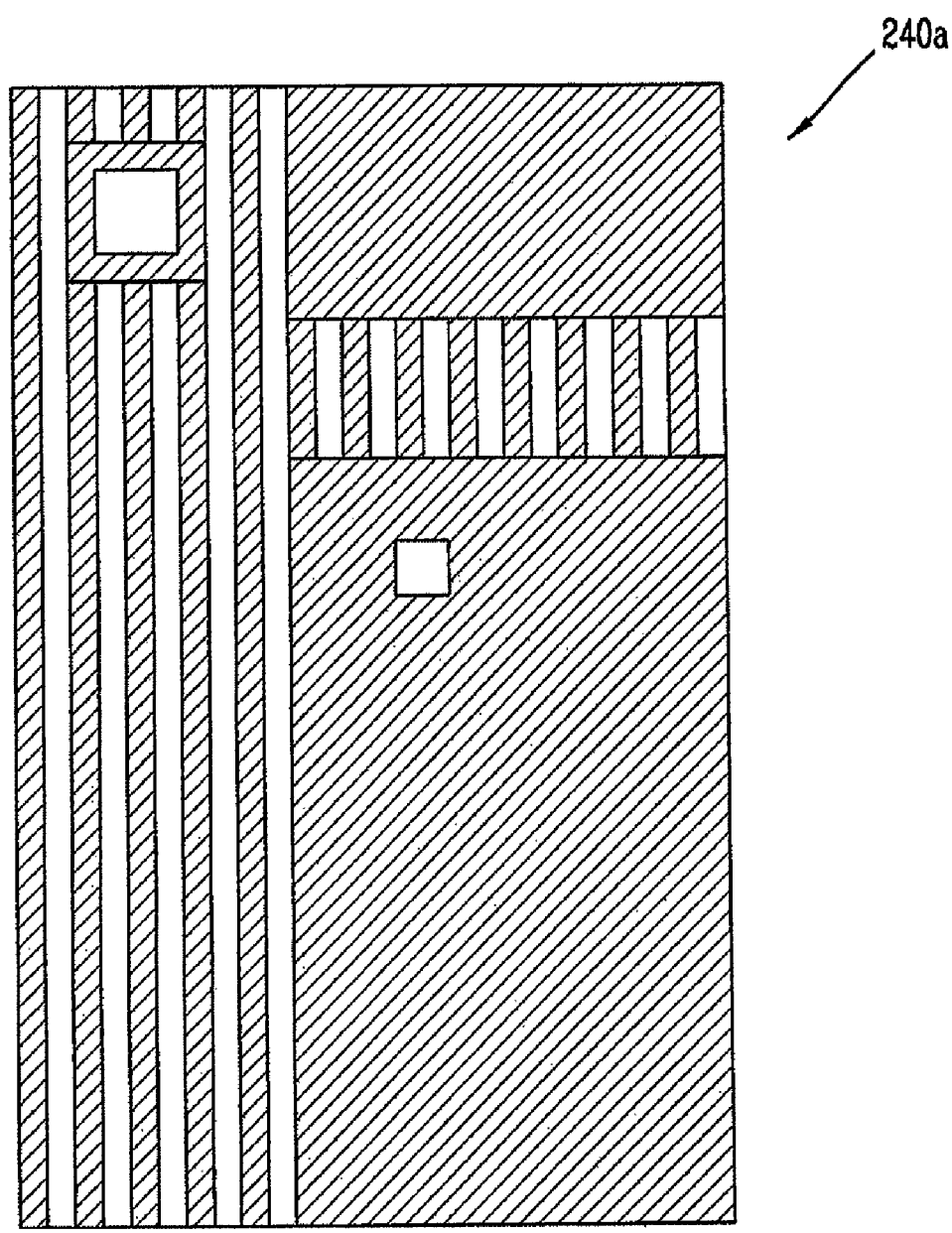
FIGS. 6A to 6C show some examples of the diffraction mask of FIG. 5.
Figure 6B:
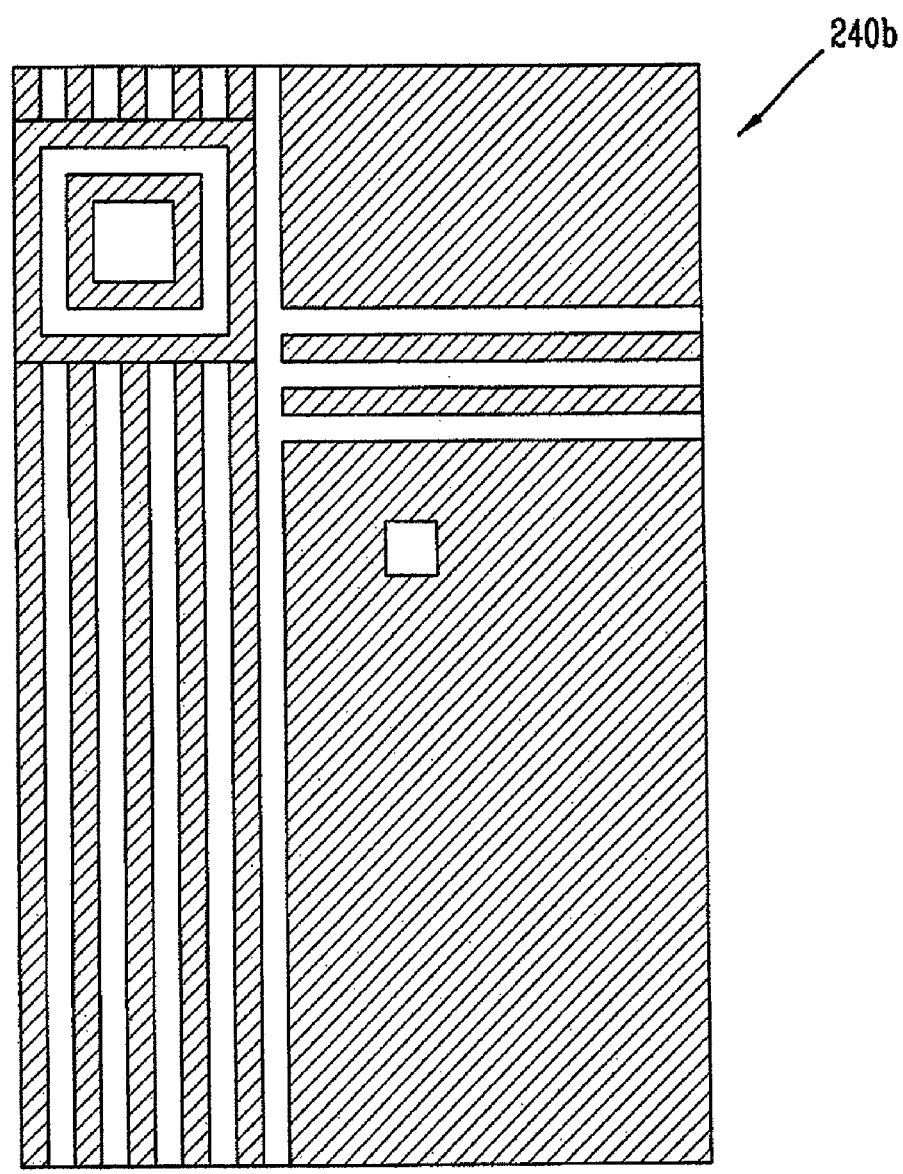
Figure 6C:
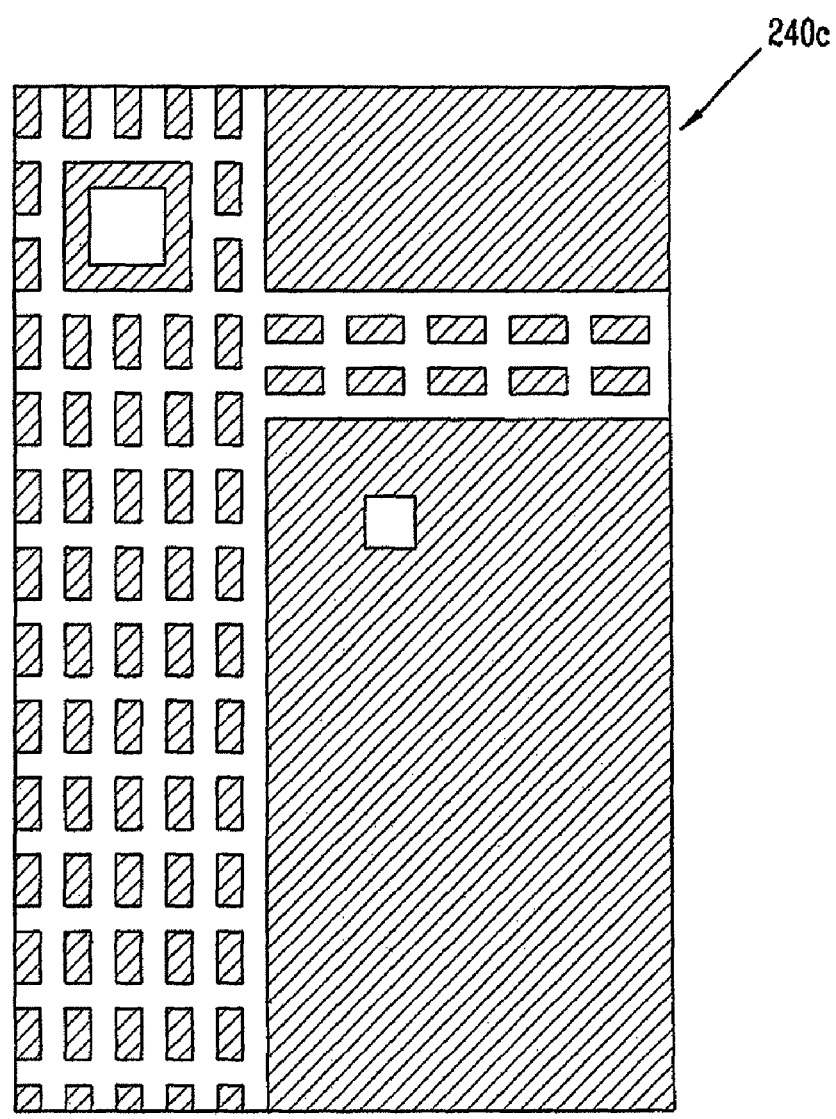

FIGS. 6A to 6C show some examples of the diffraction mask of FIG. 5. As shown in these figures, the slit diffraction pattern may have stripes in a vertical direction, a diffraction pattern formed in a concentric circle around the contact hole, and/or a dot diffraction pattern respectively in the first transmission region A1 of the diffraction masks 240a to 240c. Although the form of the diffraction pattern can vary, regardless of the pattern form, the diffraction pattern is consecutively disposed to implement diffraction over a large area.

Figure 3D:
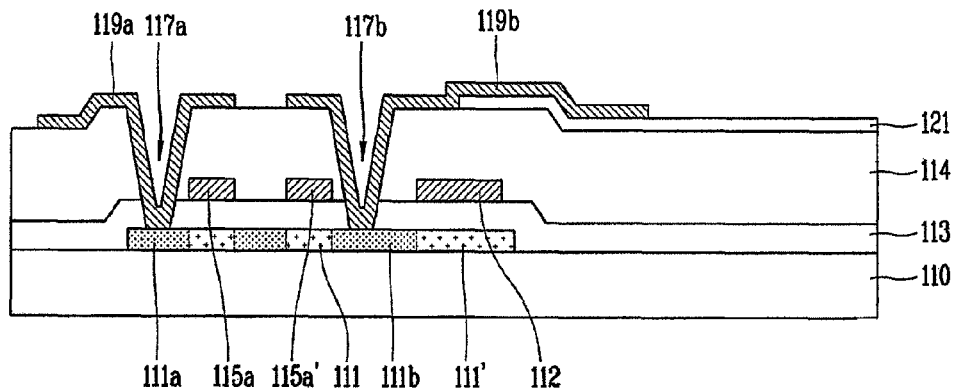

After the first and second contact holes 117a and 117b and the transmission electrode 121 are formed through the third masking process, as shown in FIG. 3D, the second metal film made of molybdenum (Mo) or a molybdenum alloy (i.e., MoTa or MoW) is formed thereon and then patterned through a fourth masking process to form a source electrode 119a and a drain electrode 119b. The source electrode 119a is electrically connected with the source region 111a through the first contact hole 117a, and one side of the drain electrode 119b is electrically connected with the drain region 111b through the second contact hole 117b and the other side of the drain region 111b is connected with the transmission electrode 121.

Figure 3E:
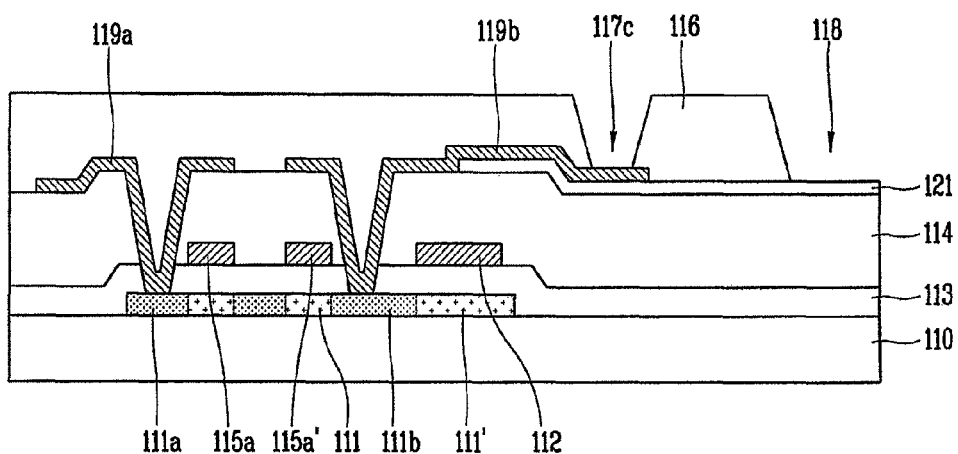

And then, as shown in FIG. 3E, an organic film such as benzocyclobutene (BCB) or photo acryl is coated at the entire surface of the substrate 110 including the source and drain electrodes 119a and 119b to form a third insulation film 116. The third insulation film 116 is then patterned through a fifth masking process to form a third contact hole 117c exposing a portion of the drain electrode 119b and a transmission hole 118 exposing the transmission electrode 121. The portion of the transmission electrode 121 exposed through the transmission hole 118 becomes the transmitting part (T).

Figure 3F:
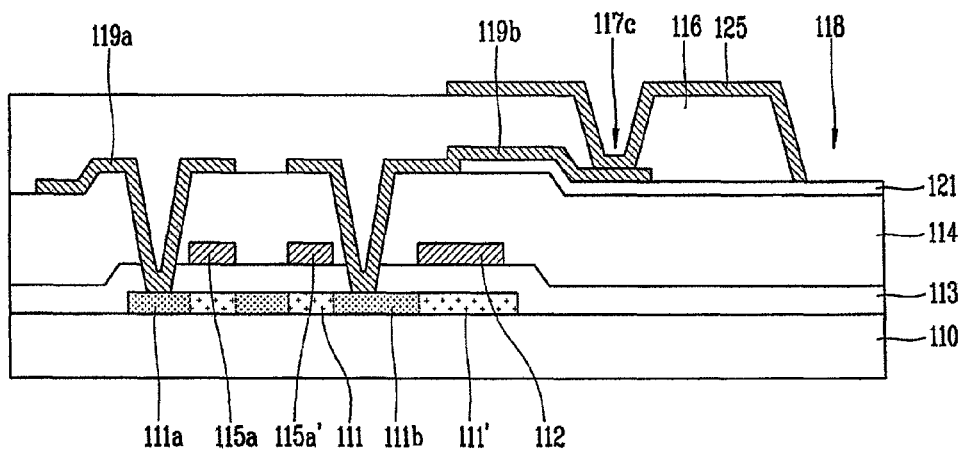

Thereafter, as shown in FIG. 3F, a third metal film having excellent reflection characteristics such as aluminum or aluminum-neodymium (AlNd) is deposited on the third insulation film 116 with the third contact hole 117c formed and then patterned to form a reflection electrode 125. The reflection electrode 125 is electrically connected with the drain electrode 119b through the third contact hole 117c.

A concavo-convex pattern can be formed on the third insulation film to form a reflection electrode having excellent reflection efficiency. For a smooth mirror type reflection electrode, light incident laterally on the reflection electrode is reflected at the same angle around normal. For example, as the light is generally incident at 30° from normal, an exit angle of the reflection light is collected at 30°. Thus, the reflectivity is excellent for the same angle as the incident angle, namely, a main viewing angle. However, because there is no reflected light toward the front reflection angle corresponding to a main use environment of a user beyond the main field angle (mirror angle), the viewing angle is very narrow.

When the surface of the reflection electrode is uneven, thereby causing the surface to have a wave-like structure, light reflected on the side of the wave is reflected at the same angle as or wider angle than the incident angle. In this case, the light reflected at the incident angle, namely, the light reflected in the direction of the main viewing angle, has the highest density. Reflected light having a reflection angle smaller or larger than the incident angle is also present. Thus, the viewing angle can be enhanced compared to the mirror-type reflection electrode.

The concavo-convex pattern can be formed by adding a single masking process. In other words, after the photoresist film is formed on the third insulation film, the third insulation film can be selectively patterned to form the concavo-convex pattern. Or, a concavo-convex pattern forming film can be additionally formed on the third insulation film and then patterned to form the concavo-convex pattern.

A diffraction mask or a half-tone mask can be used as a mask for forming the concave-convex. Alternatively, a general mask, namely, a mask consisting of a transmission region and a blocking region, can be also used.

As mentioned above, the contact holes and the transmission electrode are formed by the diffraction mask using a single masking process. A method for fabricating the trans-reflective LCD has been described, but a transmission type or reflection type LCD can be also fabricated. For a transmission type LCD, the process of forming the reflection electrode can be omitted after formation of the source/drain electrodes, and for reflection type LCD, a reflection electrode, instead of a transmission electrode, can be used.

Accordingly, a transmission type LCD, reflection type LCD and trans-reflective LCD can be fabricated, and the masking process can be reduced compared to the related art. That is, in the related art, contact holes and the transmission electrode are formed through two different masking processes. In comparison, as described above contact holes and the transmission electrode can be simultaneously formed through a single masking process using the diffraction mask or the half-tone mask, so the number of masking processes can be reduced.

In addition, in order to form contact holes and the transmission electrode through a single masking process, a large diffraction mask having a diffraction pattern is used for regions other than the region where contact holes and the transmission electrode are formed. Thus, the slits of the diffraction pattern are successively disposed in the horizontal or vertical direction, so that diffraction in a large area can be implemented.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

We claim:

1. A method for fabricating an LCD, the method comprising:

forming an active pattern on a substrate;

forming a first insulation film on the substrate having the active pattern;

forming a gate electrode on the first insulation film, wherein the gate electrode includes a first gate electrode protruding from the gate line and a second gate electrode formed as a portion of the gate line overlapping the active pattern;

forming a passivation film and a transparent conductive film on the gate electrode;

simultaneously forming contact holes and a transmission electrode using a single masking process, the contact holes exposing sides of the active pattern;

forming an opaque conductive film in the contact holes and on the transmission electrode and patterning the opaque conductive film to form a source electrode connected to a first side of the active pattern and a drain electrode connected to a second side of the active pattern and to the transmission electrode;

forming an organic film on the substrate and patterning the organic film to make a surface of the organic film concavo-convex;

patterning the concavo-convex organic film to form a contact hole exposing a portion of the drain electrode; and forming an opaque metal film on the organic film and patterning the opaque metal film on the organic film to form a reflection electrode connected to the drain electrode and the transmission electrode.

2. The method of claim 1, wherein forming the contact holes exposing the sides of the active pattern and the transmission electrode comprises:

coating a photoresist film on the passivation film;

irradiating the photoresist film with light passing through a mask, the mask having a first transmission region that transmits a portion of the light, a second transmission region that transmits substantially all of the light and a blocking region that blocks the light;

developing the irradiated photoresist film to form a first photoresist film pattern with a first thickness at a first region corresponding to the first transmission region and a second photoresist film pattern with a second thickness at a second region corresponding to the blocking region;

removing a portion of passivation film and the transparent conductive film, using the first and second photoresist film patterns as a mask, to form contact holes exposing a portion of marginal portions of the active pattern;

removing the first photoresist film pattern; and patterning the transparent conductive film, using the second photoresist film pattern as a mask, to form a transmission electrode.

3. A method for fabricating an LCD, the method comprising:

forming an active pattern and a first insulation film on a substrate;

forming a gate electrode on the first insulation film, wherein the gate electrode includes a first gate electrode protruding from the gate line and a second gate electrode formed as a portion of the gate line overlapping the active pattern;

injecting impurity ions into a region of the active pattern, using the gate electrode as a mask, to form source and drain regions;

forming a second insulation film and a conductive film on the substrate wherein the conductive film comprises one of a transparent conductive film and an opaque conductive film;

removing a portion of the conductive film and the first and second insulation films to simultaneously form a pixel electrode and first and second contact holes exposing a portion of the source and drain regions; and forming source and drain electrodes, the source electrode connected with the source region through the first contact hole, the drain electrode connected with the drain region through the second contact hole and connected with the pixel electrode with a single mask process.

* * * * *